(12) United States Patent
Zang et al.

(10) Patent No.: US 10,177,037 B2
(45) Date of Patent: Jan. 8, 2019

(54) METHODS OF FORMING A CT PILLAR BETWEEN GATE STRUCTURES IN A SEMICONDUCTOR

(71) Applicant: GLOBALFOUNDRIES Inc., Grand Cayman (KY)

(72) Inventors: Hui Zang, Guilderland, NY (US); Josef Watts, Saratoga Springs, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/496,429

(22) Filed: Apr. 25, 2017

(65) Prior Publication Data
US 2018/0308759 A1 Oct. 25, 2018

(51) Int. Cl.
*H01L 27/088* (2006.01)
*H01L 29/78* (2006.01)
(Continued)

(52) U.S. Cl.
CPC ........ *H01L 21/823437* (2013.01); *H01L 21/28247* (2013.01); *H01L 21/31111* (2013.01);
(Continued)

(58) Field of Classification Search
CPC ......... H01L 21/823431; H01L 27/0886; H01L 27/0924; H01L 27/10879; H01L 29/7831; H01L 29/66; H01L 29/66007; H01L 29/772; H01L 29/78; H01L 27/02; H01L 27/08; H01L 27/085; H01L 27/088; H01L 27/105; H01L 27/2454; H01L 25/07; H01L 25/072; H01L 21/02; H01L 21/02104; H01L 21/02107; H01L 21/02225; H01L 21/02227; H01L 21/0226; H01L 21/02318; H01L 21/02362; H01L 21/02365; H01L 21/02428; H01L 21/02436; H01L 21/02494; H01L 21/02496; H01L 21/02518; H01L 21/02656; H01L 21/02664; H01L 21/02675–21/0268;
(Continued)

(56) References Cited

U.S. PATENT DOCUMENTS 9,431,305 B1 * 8/2016 Anderson ....... H01L 21/823885
9,508,727 B2 * 11/2016 Park ................ H01L 21/823828
(Continued)

OTHER PUBLICATIONS

B.E.E. Kastenmeier et al., Highly Selective Etching of Silicon Nitride Over Silicon and Silicon Dioxide, J. Vac. Sci. Technol. A 17(6), Nov./Dec. 1999.

*Primary Examiner* — Maliheh Malek
(74) *Attorney, Agent, or Firm* — Heslin Rothenberg Farley & Mesiti P.C.; Stephen Scuderi

(57) ABSTRACT

A method includes providing a semiconductor structure having a substrate and a plurality of fins extending upwards from the substrate. A CT pillar layer is disposed over the semiconductor structure. A CT mask is lithographically patterned over the CT pillar layer. The CT mask is anisotropically etched to remove exposed portions of the CT pillar layer and to form a CT pillar between the fins. A dummy gate structure is disposed across the CT pillar. The dummy gate structure is replaced with first and second metal gate structures that are electrically isolated from each other by the CT pillar.

15 Claims, 11 Drawing Sheets

(51) Int. Cl.
*H01L 21/8234* (2006.01)
*H01L 29/66* (2006.01)
*H01L 21/311* (2006.01)
*H01L 21/28* (2006.01)
H01L 27/092 (2006.01)
H01L 25/07 (2006.01)
H01L 27/108 (2006.01)

(52) U.S. Cl.
CPC ........... *H01L 21/823431* (2013.01); *H01L 21/823481* (2013.01); *H01L 27/0886* (2013.01); *H01L 29/6653* (2013.01); *H01L 29/66545* (2013.01); H01L 27/0924 (2013.01); H01L 27/10879 (2013.01); H01L 29/7831 (2013.01)

(58) Field of Classification Search
CPC ............. H01L 21/02697; H01L 21/027; H01L 21/033; H01L 21/0337; H01L 21/0338; H01L 21/3213; H01L 21/32133–21/32139; H01L 21/47573; H01L 21/47635; H01L 21/823437; H01L 21/823462; H01L 21/823468
See application file for complete search history.

(56) References Cited

U.S. PATENT DOCUMENTS

| | | | | |
|---|---|---|---|---|
| 9,721,848 B1* | 8/2017 | Bu | ............. | H01L 21/823431 |
| 9,761,495 B1* | 9/2017 | Xie | ............. | H01L 21/823431 |
| 9,805,983 B1* | 10/2017 | Cheng | ........... | H01L 21/823475 |
| 9,818,836 B1* | 11/2017 | Sung | .............. | H01L 29/513 |
| 9,899,267 B1* | 2/2018 | Liou | ........... | H01L 21/823878 |
| 9,905,473 B1* | 2/2018 | Bouche | ......... | H01L 21/823475 |
| 9,911,736 B1* | 3/2018 | Zang | ............. | H01L 27/0886 |
| 9,929,157 B1* | 3/2018 | Xie | ............. | H01L 27/0886 |
| 9,935,112 B1* | 4/2018 | Zang | ............. | H01L 27/1104 |
| 9,960,077 B1* | 5/2018 | Zang | ............ | H01L 21/76264 |
| 9,972,495 B1* | 5/2018 | Wu | .............. | H01L 21/28123 |
| 9,991,361 B2* | 6/2018 | Dai | ............. | H01L 29/66795 |
| 10,014,298 B1* | 7/2018 | Zang | ............ | H01L 27/0886 |
| 10,014,304 B2* | 7/2018 | Park | ............ | H01L 21/823828 |
| 10,026,740 B1* | 7/2018 | Zang | ............ | H01L 27/10805 |
| 10,056,469 B1* | 8/2018 | Li | ............. | H01L 29/66545 |
| 2005/0124099 A1* | 6/2005 | Beintner | ......... | H01L 21/823437 438/164 |
| 2006/0046394 A1* | 3/2006 | Ramaswamy | .... | H01L 29/66553 438/268 |
| 2014/0001564 A1* | 1/2014 | Song | ............. | G06F 17/5081 257/369 |
| 2015/0270268 A1* | 9/2015 | Fujikawa | ........ | H01L 21/823437 257/329 |
| 2016/0056181 A1* | 2/2016 | Anderson | .......... | H01L 27/1211 257/347 |
| 2016/0064662 A1* | 3/2016 | Masuoka | ............. | H01L 45/06 257/4 |
| 2016/0133632 A1* | 5/2016 | Park | ............. | H01L 21/823828 257/369 |
| 2016/0172378 A1* | 6/2016 | Chou | ............. | H01L 27/1211 257/347 |
| 2016/0233164 A1* | 8/2016 | Choi | ............. | H01L 27/0924 |
| 2016/0308046 A1* | 10/2016 | Masuoka | .......... | H01L 29/66545 |
| 2017/0040328 A1* | 2/2017 | Park | ............. | H01L 21/823828 |
| 2017/0084723 A1* | 3/2017 | Greene | ............. | H01L 29/7856 |
| 2017/0148682 A1* | 5/2017 | Basker | ............. | H01L 21/823431 |
| 2017/0243790 A1* | 8/2017 | Xie | ............. | H01L 21/823431 |
| 2017/0345820 A1* | 11/2017 | Lin | ............. | H01L 21/823481 |
| 2017/0345913 A1* | 11/2017 | Dai | ............. | H01L 29/66795 |
| 2018/0012839 A1* | 1/2018 | Zang | ............. | H01L 21/76805 |
| 2018/0053694 A1* | 2/2018 | Cheng | ............. | H01L 21/823475 |
| 2018/0069000 A1* | 3/2018 | Bergendahl | ......... | H01L 27/0886 |
| 2018/0090598 A1* | 3/2018 | Xi E; Ruilong | ............. | H01L 29/66666 |
| 2018/0182757 A1* | 6/2018 | Xie | ............. | H01L 27/0886 |
| 2018/0204836 A1* | 7/2018 | Lin | ............. | H01L 21/823481 |
| 2018/0233579 A1* | 8/2018 | Li | ............. | H01L 29/66545 |
| 2018/0254220 A1* | 9/2018 | Leobandung | ......... | H01L 21/845 |
| 2018/0261514 A1* | 9/2018 | Xie | ............. | H01L 21/823828 |
| 2018/0261596 A1* | 9/2018 | Jun | ............. | H01L 29/0646 |

\* cited by examiner

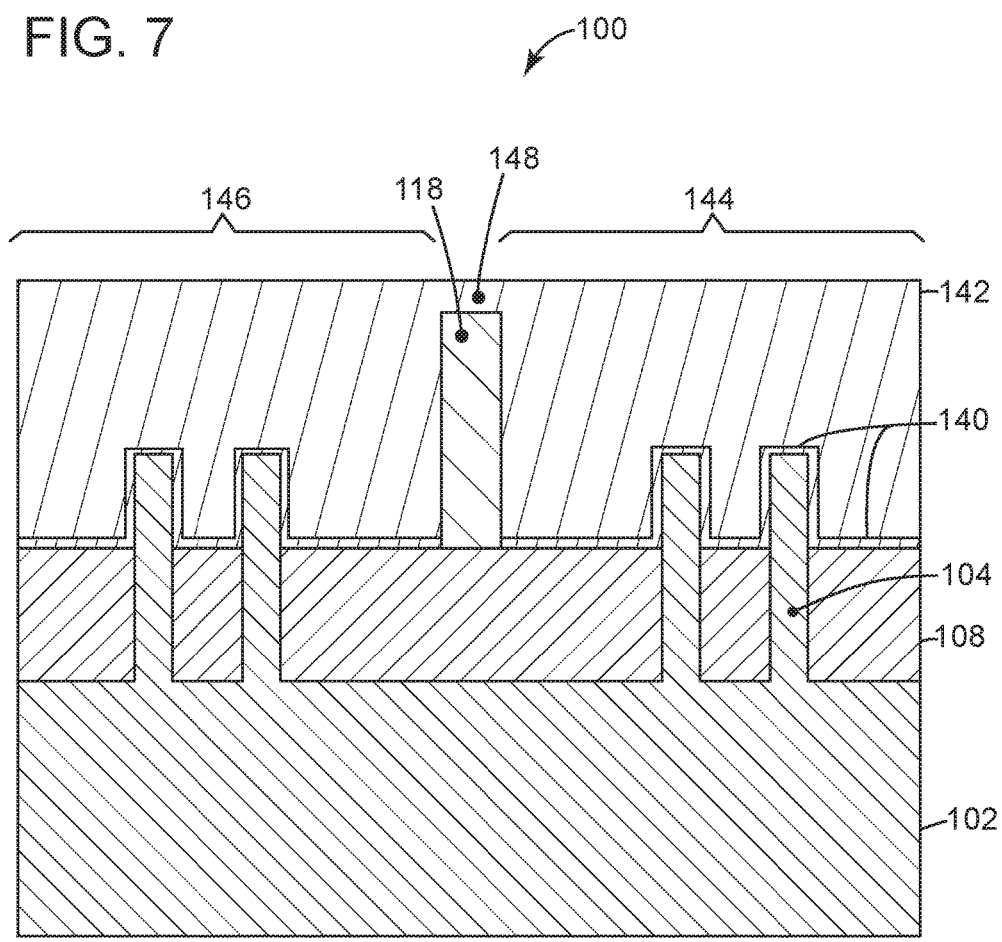

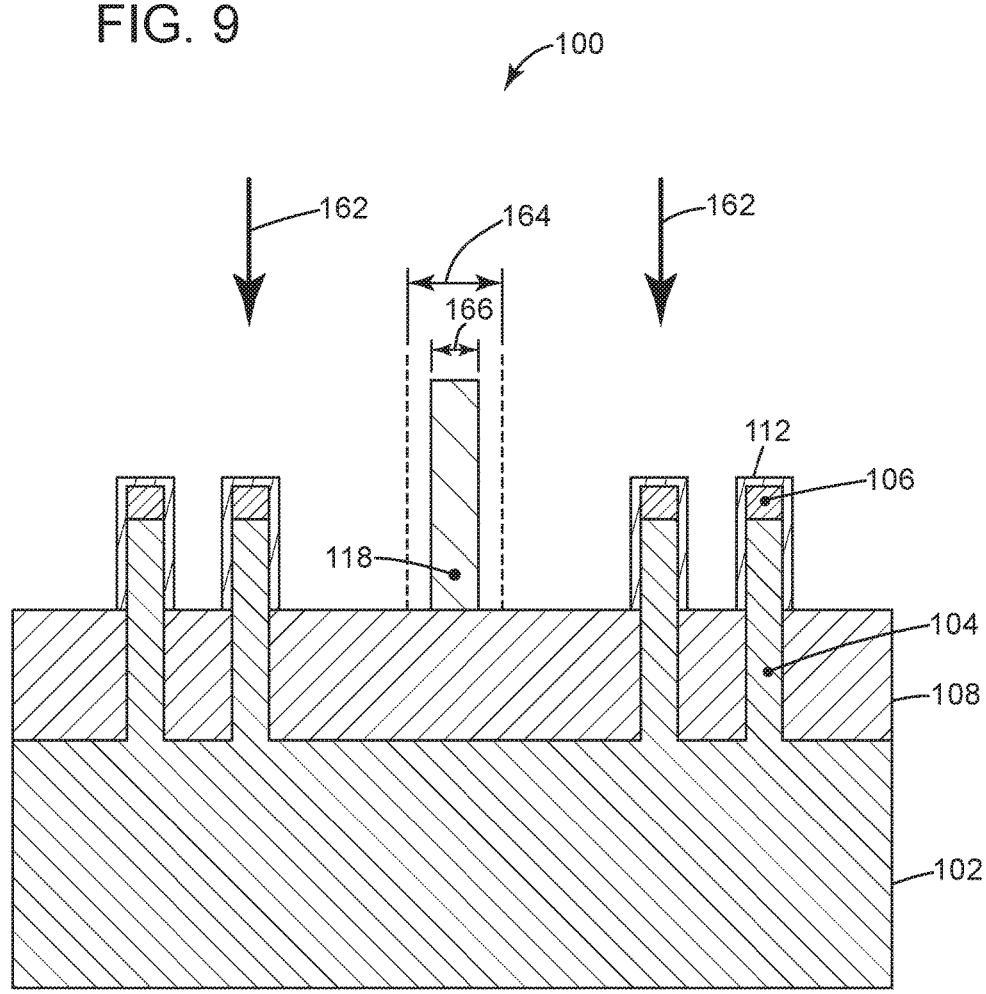

METHODS OF FORMING A CT PILLAR BETWEEN GATE STRUCTURES IN A SEMICONDUCTOR

TECHNICAL FIELD

The present invention relates to semiconductor devices and methods of making the same. More specifically, the invention relates to methods of forming an electrically isolating CT pillar between adjacent gate structures in a semiconductor structure.

BACKGROUND

CT pillars terminate the tip ends of gate structures in a semiconductor structure (or semiconductor). CT pillars provide tip to tip electrical isolation between gate structures disposed in separate active (Rx) regions of a semiconductor. In a semiconductor, Rx regions are where a plurality of active devices, such as Fin Field Effect Transistors (FinFETs), are disposed. The Rx regions are separated by isolation regions which have no active devices.

More specifically for FinFETs, these active devices include a source and drain region separated by a channel. The source, drain and channel are embedded in fins which extend longitudinally across an Rx region. The FinFETs also include gate structures which extend longitudinally perpendicular to the fins across the entire width of the Rx region.

Herein, the direction longitudinal to the fins is designated the "Y" direction and the direction perpendicular, or lateral, to the fins is designated the "X" direction. Therefore, the fins extend longitudinally in the Y direction and the gate structures extend longitudinally in the X direction.

In order to assure proper functioning of the FinFETs, the tip end of a gate structure cannot be terminated by a CT pillar at an edge of the last fin in an Rx region. Rather, the gate structure must be designed to overextend a predetermined minimum distance in the X direction beyond the Rx region, and into the isolation region, before being terminated by a CT pillar. Therefore, the minimum distance between one FinFET in one Rx Region and another FinFET in another adjacent Rx region must at least include the thickness of a CT pillar plus two minimum overextensions of gate structure beyond each Rx region. With constant downscaling and increasingly demanding requirements to the speed and functionality of ultra-high density integrated circuits, it becomes increasingly desirable to reduce the thickness of such CT pillars, and therefore, reduce the minimum distance between Rx regions.

Prior art CT pillars may be formed by first lithographically patterning CT openings into a hardmask layer and then anisotropically etching a CT trench (or CT cut) into an underlying polysilicone dummy gate structure (for example, by a reactive ion etching (RIE) process). However, at about the 14 nanometer (nm) class of semiconductors and beyond, the required thickness of the CT pillar becomes too small to be reliably resolved by conventional lithographic techniques. As such, an exemplary embodiment of a lithographically patterned CT pillar will have a minimum width of about 20 nm or greater.

An alternative method of forming prior art CT pillars can include lithographically patterning CT openings into an amorphous carbon layer (ACL) of a lithographic stack, wherein the ACL is disposed above an array of polysilicon dummy gate structures (or dummy gates). Carbon spacers can then be formed on the side walls of the CT openings to reduce the width of the CT openings. The underlying dummy gates can then be RIE etched to form CT trenches in the dummy gates. The CT trenches can then be refilled with an insulator such as silicon nitride (SiN) or similar to form the CT pillars. However, the CT trenches become increasingly difficult to refill completely and uniformly at smaller semiconductor class sizes (such as 10 nm and beyond) due to their high aspect ratio (for example an aspect ratio of 10 or greater). Accordingly, the refilled CT trenches may include voids or air gaps in them that can cause electrical shorts when the polysilicone dummy gates are replaced by metal gates during a subsequent replacement metal gate (RMG) process.

Accordingly, there is a need for methods of forming CT pillars in gates that will enable reliable formation of such CT pillars with widths of less than 20 nm. Moreover there is a need for methods of forming CT pillars that are less susceptible to the resolution limitations of lithographic techniques. Additionally, there is a need for methods of forming CT pillars that do not require refilling high aspect ratio CT trenches in gate structures, and which can avoid voids and gaps in the CT pillars.

BRIEF DESCRIPTION

The present invention offers advantages and alternatives over the prior art by providing a CT pillar that is formed by etching a CT pillar layer rather than refilling a high aspect ratio CT trench. As such the CT pillar can be formed without any voids or gaps. Additionally, the CT pillar can be formed with widths of 15 nm or less and is less susceptible to the resolution limitations of lithographic techniques.

A method in accordance with one or more aspects of the present invention includes providing a semiconductor structure having a substrate and a plurality of fins extending upwards from the substrate. A CT pillar layer is disposed over the semiconductor structure. A CT mask is lithographically patterned over the CT pillar layer. The CT mask is anisotropically etched to remove exposed portions of the CT pillar layer and to form a CT pillar between the fins. A dummy gate structure is disposed across the CT pillar. The dummy gate structure is replaced with first and second metal gate structures that are electrically isolated from each other by the CT pillar.

A semiconductor structure in accordance with one or more aspects of the present invention includes a first metal gate structure extending over an isolation region. The first metal gate structure has a first metal stack layer disposed over a first dielectric layer and gate spacers disposed on sidewalls of the first metal stack layer. A second metal gate structure extends over the isolation region. The second metal gate structure has a second metal stack layer disposed over a second dielectric layer and the gate spacers disposed on sidewalls of the second metal stack layer. A CT pillar is disposed in the isolation region and electrically isolates the first and second gate structures. The first and second metal stack layers are recessed below a height of the CT pillar. The CT pillar is self-aligned with the gate spacers. A self-aligned contact (SAC) cap is disposed over the CT pillar. The SAC cap is self-aligned with the gate spacers.

DRAWINGS

The invention will be more fully understood from the following detailed description taken in conjunction with the accompanying drawings, in which:

FIG. 7 is a cross section view of the semiconductor structure of FIG. 6C taken through the line 7-7 of FIG. 6C after a replacement metal gate (RMG) process is completed to form first and second metal gate structures in accordance with the present invention;

FIG. 9 is an alternative side view of the semiconductor structure of FIG. 4 having a CT pillar etched from an ultraviolet (UV) curable nitride material in accordance with the present invention.

DETAILED DESCRIPTION

Certain exemplary embodiments will now be described to provide an overall understanding of the principles of the structure, function, manufacture, and use of the methods, systems, and devices disclosed herein. One or more examples of these embodiments are illustrated in the accompanying drawings. Those skilled in the art will understand that the methods, systems, and devices specifically described herein and illustrated in the accompanying drawings are non-limiting exemplary embodiments and that the scope of the present invention is defined solely by the claims. The features illustrated or described in connection with one exemplary embodiment may be combined with the features of other embodiments. Such modifications and variations are intended to be included within the scope of the present invention.

Figure 1:
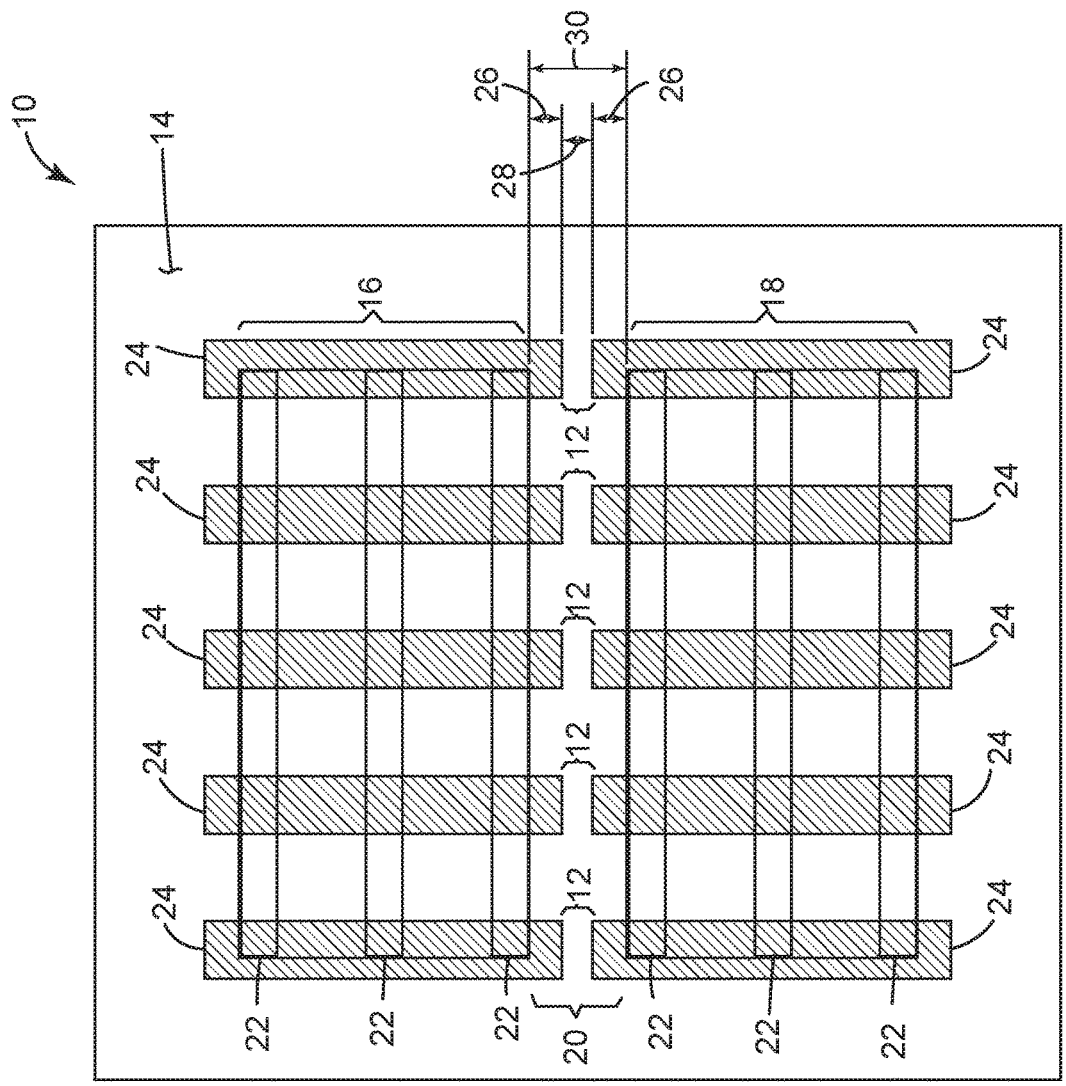
FIG. 1 is a top view of a semiconductor structure at an intermediate stage of manufacture, wherein a plurality of CT trenches are formed utilizing a prior art method of making those CT trenches.
Figure 2A:
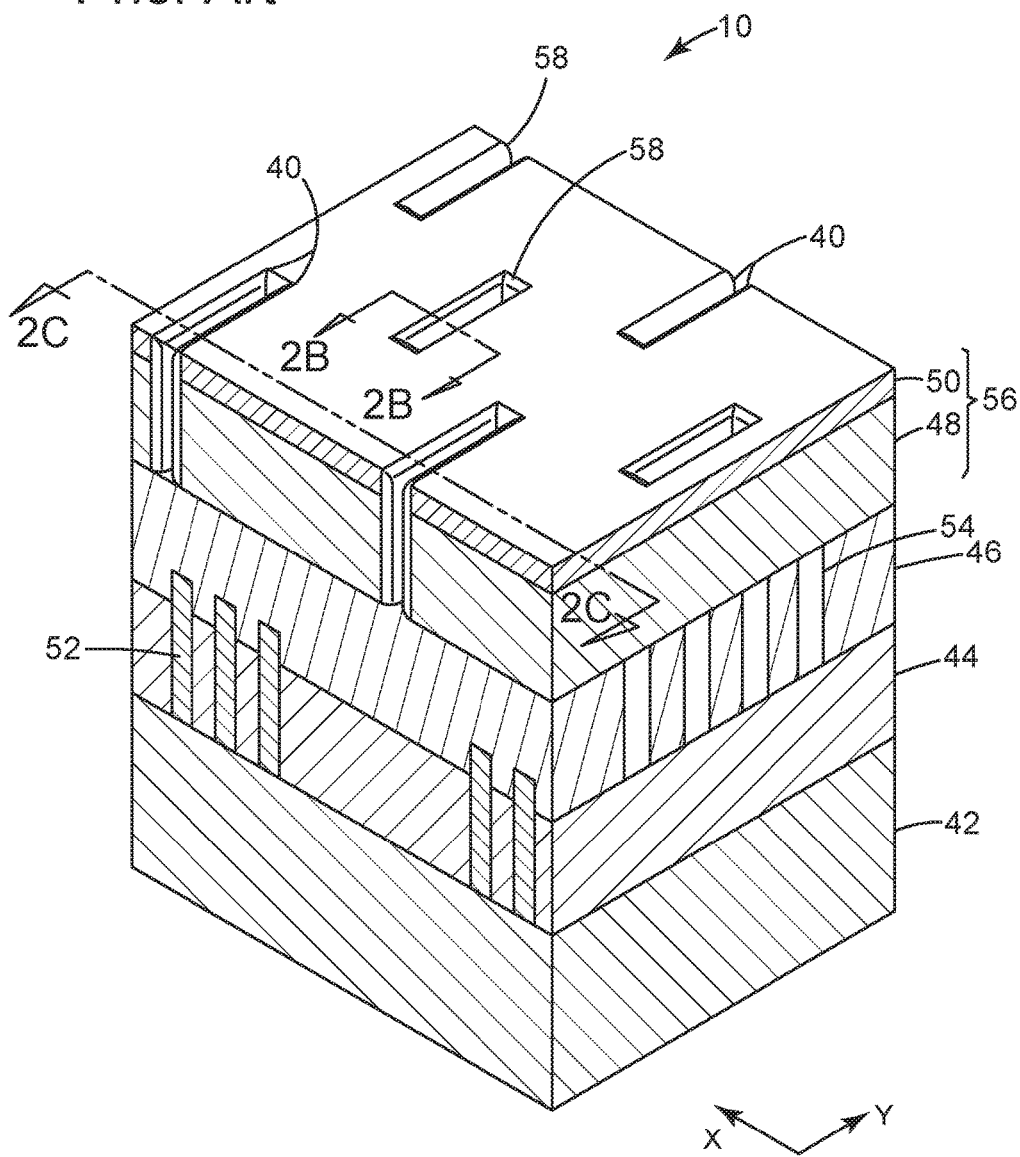
FIG. 2A is a perspective view of a semiconductor structure at an intermediate stage of manufacture, wherein a plurality of CT openings are formed utilizing an alternative prior art method of making CT pillars.
Figure 2B:
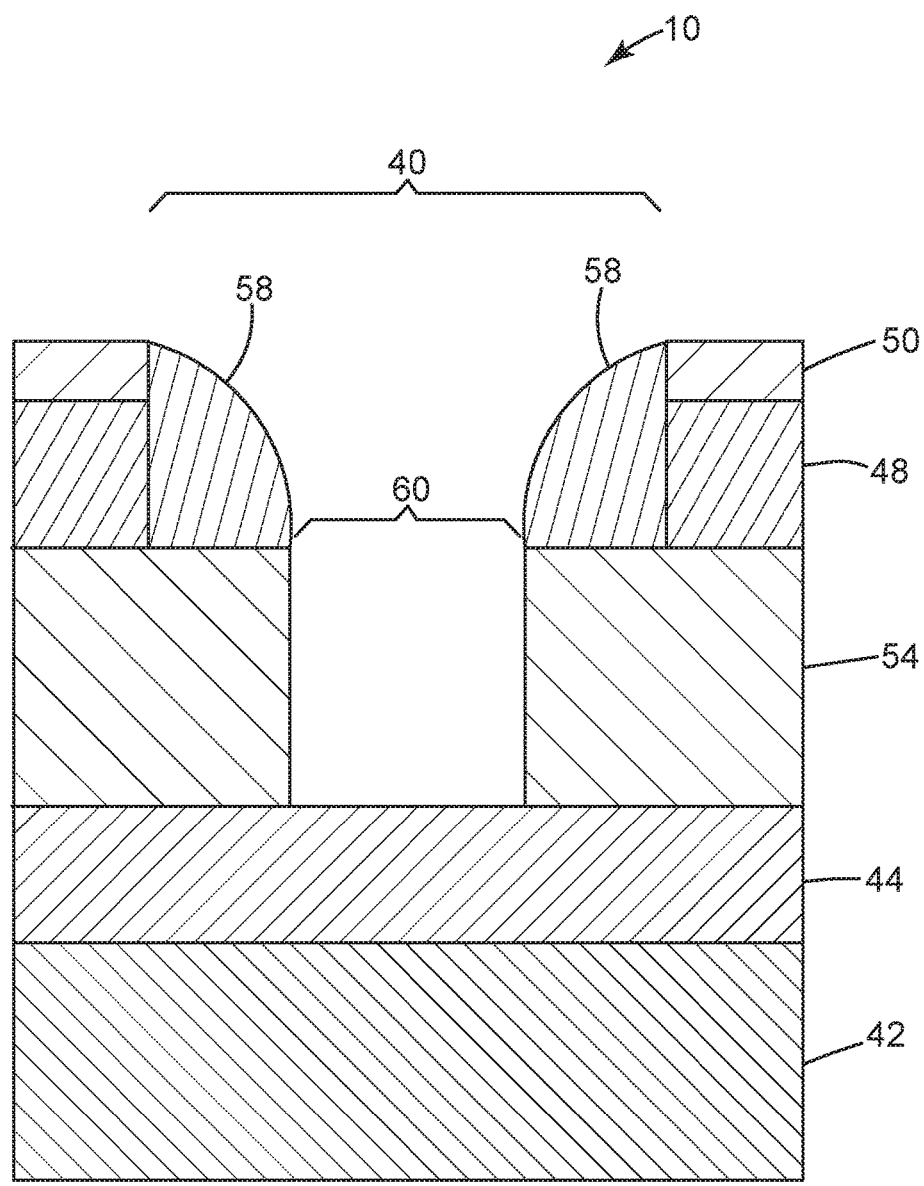
FIG. 2B is a side view of a CT trench formed into a dummy gate of the semiconductor structure of FIG. 2A taken along the line 2B-2B of FIG. 2A.
Figure 2C:
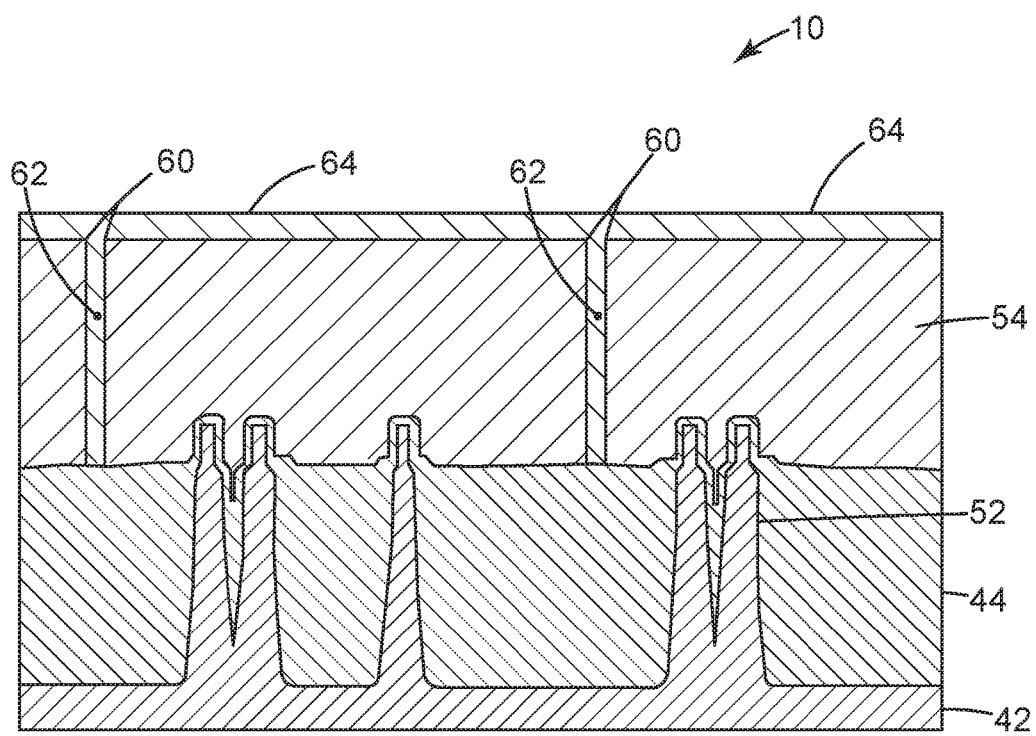
FIG. 2C is a side view of CT pillars formed into the CT trenches of the semiconductor structure of FIG. 2A taken along the line 2C-2C of FIG. 2A.

FIGS. 1-2C illustrate various exemplary embodiments of prior art methods of forming CT pillars. FIGS. 3-9 illustrate various exemplary embodiments of a method of forming CT pillars in accordance with the present invention.

Referring to FIG. 1, a top view of a semiconductor structure 10 at an intermediate stage of manufacture, wherein a plurality of CT trenches 12 are formed utilizing a prior art method of making those CT trenches 12 is presented. The CT trenches will subsequently be filled with a dielectric material such as silicon nitride (SiN) to form CT pillars.

Semiconductor structure 10 includes a substrate (or substrate layer) 14 with a first (1st) Rx region 16 and an adjacent second (2nd) Rx region 18. The 1st and 2nd Rx regions 16, 18 are separated by an isolation region 20.

Within each Rx region 16, 18 a plurality of parallel fins 22 extends upward from the substrate 14. Also within each Rx region 16, 18, a plurality of polysilicon dummy gate structures (or dummy gates) 24 are disposed over the fins 22 and extend perpendicular to the fins 22.

In order to assure proper functioning of the FinFETs, the tip ends of gate structures 24 must overextend a predetermined minimum overextension distance 26 beyond the Rx regions 16, 18, and into the isolation region 20, before being terminated by the CT trenches 12. Therefore, the overall minimum distance 30 between Rx regions 16, 18 is equal to the sum of two overextension distances 26 plus a minimum CT thickness 28.

For purposes of scaling, it is desirable to be able to down size the CT thickness 28 in order to reduce the overall minimum distance 30 between Rx regions 16, 18. However, the CT thickness 28 depends on the method of making the CT trenches 12 (and ultimately the CT pillars (not shown) that will be formed from the CT trenches 12. A prior art method of making the CT trenches shown in FIG. 1 starts with disposing a polysilicon dummy gate layer (not shown) over the structure 10 and then a hardmask layer (not shown) over the dummy gate layer. Partially formed dummy gate structures 24 are next lithographically patterned into the hardmask layer. CT openings (or CT cuts) are then lithographically patterned into the partially formed dummy gates 24. Once both the partially formed dummy gate structures 24 and CT openings are patterned into the hardmask layer, the exposed polysilicon (not protected by the hardmask layer) is anisotropically etched, by a RIE process or similar. The RIE process completes formation of the dummy gates 24 into the polysilicon layer. The RIE process also transfers the CT opening into the polysilicon layer to form the CT trenches 12.

This method of forming CT trenches 12 (and ultimately CT pillars) is often referred to as a "cuts first" method. This is because the CT openings are formed into the hardmask layer before the RIE process cuts the polysilicon layer to form dummy gate structures 24 and CT trenches 12.

However, since the CT trenches 12 in this method are solely dependent on the resolution of the lithographic process applied to form them, the CT thickness 28 can only be downsized to about 20 nm. Additionally, the overextension distance 26 cannot be made much smaller than 15 nm, in order to prevent subsequent epitaxial formation of the source and drain regions from extending past the overextension distance 26 and shorting together in the area of the CT trenches 12. Accordingly, the overall distance 30 using this method can be downsized to about 50 nm.

Referring to FIG. 2A, a perspective view of the semiconductor structure 10 at an intermediate stage of manufacture, wherein a plurality of CT openings 40 are formed utilizing an alternative prior art method of making CT pillars 62 (best seen in FIG. 2C) is presented. In this embodiment, the semiconductor structure 10 includes a substrate layer 42. A flowable oxide (FOX) layer 44, an insulating layer 46, an amorphous carbon layer 48 and a SiON layer 50 are disposed respectively over the substrate layer 42.

Extending upwards from the substrate 42 is and array of parallel fins 52. The fins 52 extend upward through the FOX layer 44 and into the insulating layer 46, wherein the portion of the fins disposed in the insulating layer 46 defines an active region of the fins 52. Extending longitudinally through the insulating layer and perpendicular to the fins 52 is an array of fully formed parallel polysilicon dummy gates 54. The dummy gates 54 are disposed over the active region of the fins 52 (best seen in FIG. 2C).

The amorphous carbon layer 46 and SiON layer 50 are the remaining layers of a lithographic stack of layers 56. The lithographic stack 56 can be composed of several different kinds of layers, depending on such parameters as the application requirements, design or proprietary preferences or the like. In this embodiment the stack of layers 56 included (from top to bottom) a resist layer (not shown), a bottom antireflective coating layer (not shown), the SiON dielectric layer 50 and the amorphous carbon layer 48.

The lithographic stack 56 was utilized to pattern the CT openings 40 into the SiON layer 50 and amorphous carbon layer 48. Note that the CT openings 40 do not extend down into the insulating layer 46 or into the dummy gates 54. Once that was done, the resist layer and BARC layer were removed.

After formation of the CT openings 40, CT spacers 58 (best seen in FIG. 2B) were formed on sidewalls of the CT openings 40. The CT spacers 58 could be formed by atomic layer deposition (ALD) of a spacer layer and then RIE etching the spacer layer to form the CT spacers 58.

Referring to FIG. 2B, a side view of a CT trench 60 formed into a dummy gate 54 of structure 10 taken along the line 2B-2B of FIG. 2A is presented. Once the CT spacers 58 are formed in this prior art exemplary method, the exposed dummy gates 54 at the bottom of the CT openings 40 can be anisotropically etched (by a RIE etch process or similar) to form CT trenches 60 in the dummy gates 54.

Referring to FIG. 2C, a side view of CT pillars 62 formed into the CT trenches 60 of structure 10 taken along the line 2C-2C of FIG. 2A is presented. Once the CT trenches 60 are formed in this prior art exemplary method the SiON layer 50, amorphous carbon layer 48 and CT spacers 58 can be removed as, for example, by wet etch or similar. Then a SiN refill layer 64 can be disposed over the structure 10 and planarized down to form the CT pillars 62 in the CT trenches 60.

However, the CT trenches 60, have a high aspect ratio (for example an aspect ratio of 10 or greater). Moreover, the aspect ratio tends to increase as the structure 10 is scaled down. As such, it becomes increasingly difficult to completely fill the trenches 60 with the SiN refill layer 64 and to avoid the formation of voids and gaps within the CT pillars 62. With the formation of such voids and gaps, electrical shorts can develop across the voids and gaps when the polysilicon dummy gates 54 are replaced by metal gates later during the manufacturing process.

Figure 3:
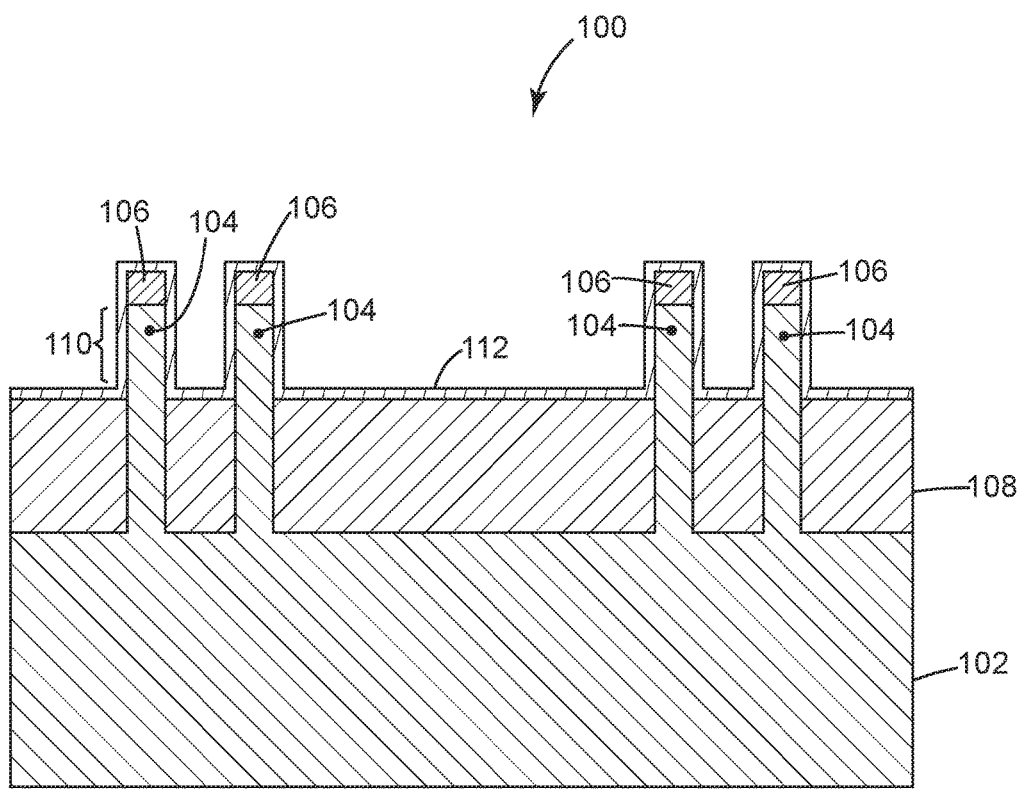
FIG. 3 is a side cross sectional view of a semiconductor structure at an intermediate stage of manufacture, wherein a plurality of CT pillars are to be formed utilizing a method of making those CT pillars in accordance with the present invention.

Referring to FIG. 3, is a side cross sectional view of a semiconductor structure 100 at an intermediate stage of manufacture, wherein a plurality of CT pillars are to be formed utilizing a method of making those CT pillars in accordance with the present invention. Semiconductor structure 100 includes a substrate layer (or substrate) 102 having a plurality of parallel fins 104 extend upwards therefrom. The substrate layer 102 and fins 104 may be composed of silicon (Si) or similar.

Portions of a hardmask layer 106 are disposed over the top surfaces of the fins 104. The hardmask layer 106 was previously disposed over the substrate 102, lithographically patterned and then anisotropically etched (for example with a RIE process) to form the fins 104 as is well known. The hardmask layer 106 may be composed of a SiN or similar material.

An oxide layer (such as a flowable oxide layer (FOX)) 108 is then disposed over the structure 100 such that the fins 104 extend through the FOX layer 108. The upper portion 110 of the fins 104 that extend vertically beyond the top surface of the FOX layer 108 is the active region 110 of the fins 104.

A protective oxide layer 112 is then disposed over the entire structure 100. The protective oxide layer 112 protects the integrity of the fins 104 during subsequent etching processes. The protective oxide layer 112 may be composed of the same type of oxide as the FOX layer 108. The protective oxide layer 112 may also be composed of a silicon dioxide (SiO2) or similar.

Figure 4:
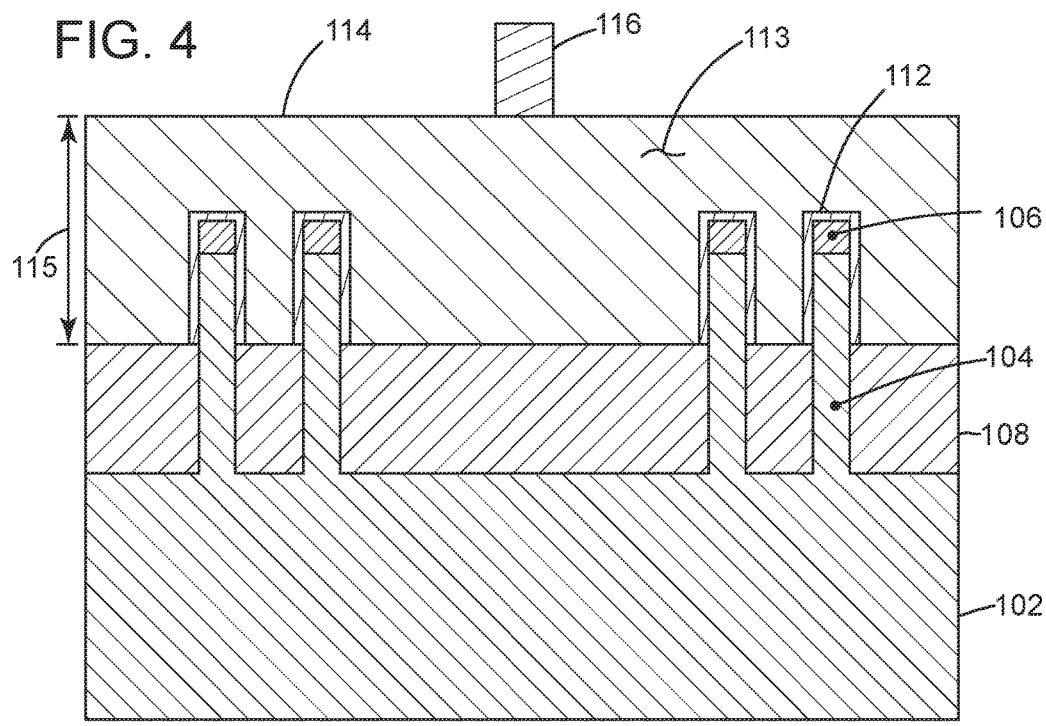
FIG. 4 is a cross sectional side view of the semiconductor structure FIG. 3 with a CT pillar layer disposed thereon in accordance with the present invention.

Referring to FIG. 4, a cross sectional side view of structure 100 with a CT pillar layer 113 disposed thereon is presented. The CT pillar layer 113 may be composed of SiN or similar. The CT pillar layer may be disposed over structure 100 via chemical vapor deposition (CVD), physical vapor deposition (PVD) or similar. The CT pillar layer 113 can then be subjected to a chemical mechanical polishing (CMP) process to flatten its top surface 114 to a predetermined height 115 above the substrate layer 102.

Next, a CT mask 116 is lithographically patterned over the CT pillar layer 113.

The CT mask 116 may be patterned by, for example, disposing a lithographic stack over the CT pillar layer 113. The lithographic stack may include an amorphous carbon layer, a SiON layer, a BARC layer and a photo resist layer. The lithographic stack can then be patterned and etched to form the CT mask 116 disposed over the CT pillar layer 113. The CT mask 116 can be composed of the photo resist material from the photo resist layer, or any combination of the materials from the layers in the lithographic stack, such as photo resist, SiON, and/or amorphous carbon.

Figure 5:
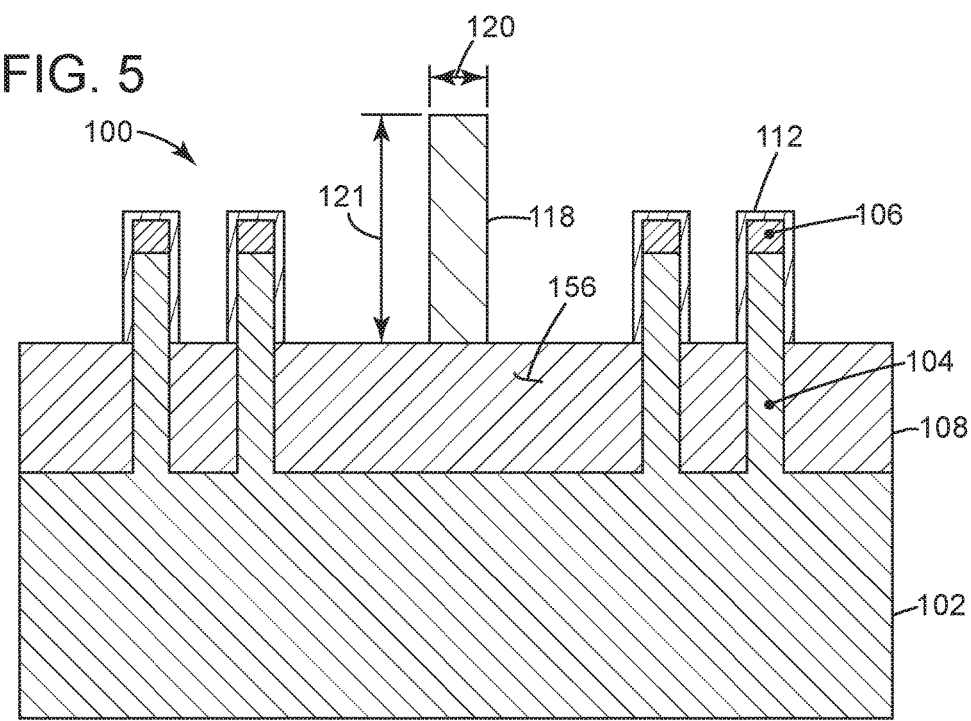
FIG. 5 is the semiconductor structure of FIG. 4 with a CT pillar etched into the CT pillar layer in accordance with the present invention.

Referring to FIG. 5, the CT mask is then anisotropically etched to remove exposed portions of the CT pillar layer 114 and to form a CT pillar 118 over an isolation region 156 between the fins 104. The anisotropical etching may be accomplished by a RIE process or similar. During the RIE process, the protective oxide layer 112 protects the silicon fins 104 from damage.

Once anisotropically etched, a width 120 of the CT pillar 118 can then be reduced from an initial width to a predetermined final width. During this process, a height 121 of the CT pillar 118 may also be reduced. One way to reduce the width 120 of CT pillar 118 in a controlled and accurate manner is to subject the CT pillar 118 to a trimming process. It is important to note that trimming can achieve critical dimensions, such as the CT pillar width 120, which are beyond the resolution limits of conventional lithography. Such a trimming process can utilize a dry plasma etching process to laterally trim the CT pillar 118.

Oxygen may be used as the main etch gas in such a trim operation because oxygen based plasmas etch polymers isotropically. Halogens (such are HBr, HCl, Cl2), fluorocarbon gases, argon or the like can be added to provide control over the ratio of lateral etch rate (e.g., the etch rate of the width 120) vs. vertical etch rate (e.g., the etch rate of the height 121). The lateral trimming of the width 120 of the CT pillar 118 can be made slow enough to allow the trimmed width 120 to be formed in a controlled and reproducible manner without reducing the height 121 to an unacceptable level. For example, a lateral etch rate in the range of 150 to 200 Angstroms per minute for features smaller than 1 micron in width can be achieved.

By using the trimming process described or similar, the width 120 of the CT pillar 118 can be reduced to 15 nm or less. Additionally using such a trimming process, the width 120 can be reduced to 10 nm or less.

It is also important to note that the CT pillar 118 was formed by an anisotropic etching process, such as a RIE process. This is in contract to the prior art processes described earlier, wherein a high aspect ratio CT trench (such as CT trench 12 in prior art FIG. 1 and CT trench 60 in prior art FIG. 2B) is formed and must be refilled with a pillar material (such as SiN) to form the final CT pillar. As such, the CT pillar 118 will be devoid of any gaps and voids that could cause an electrical short when the metal gate is formed later in the process.

Figure 6A:
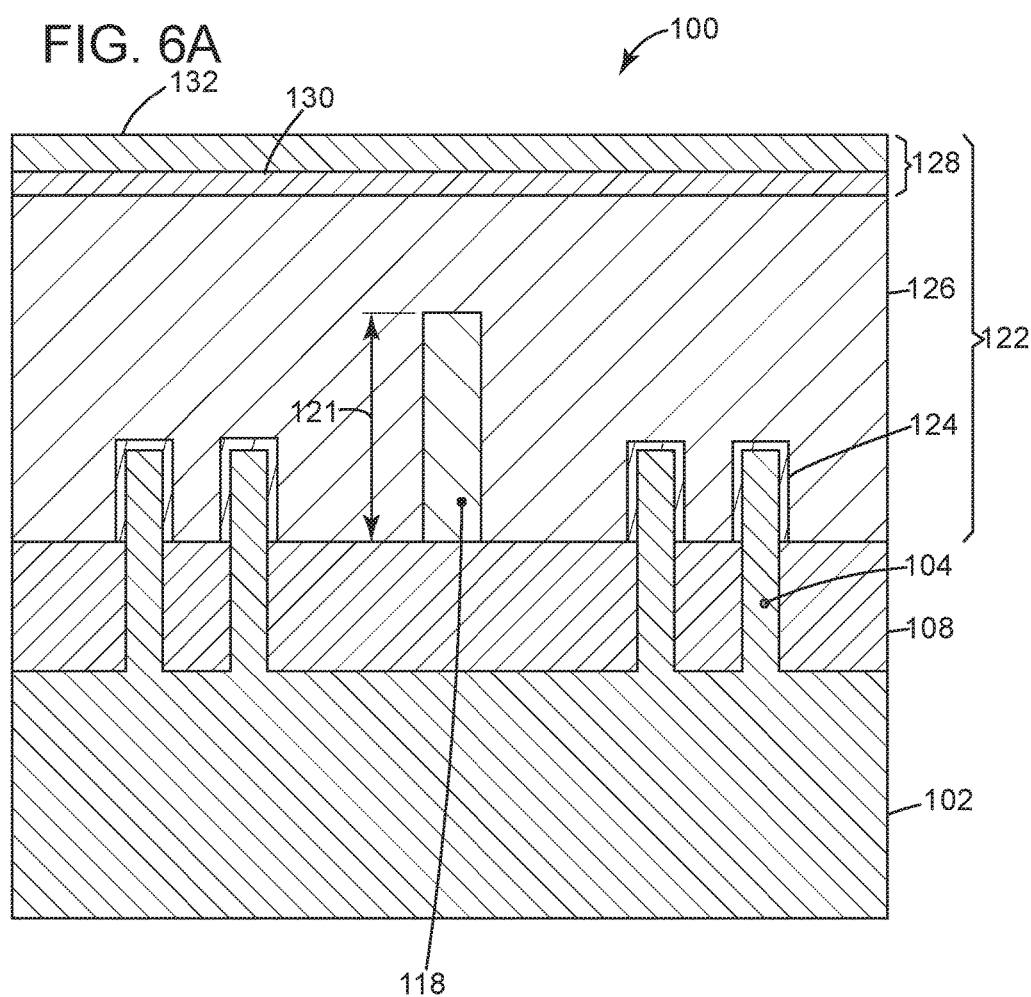
FIG. 6A is a cross sectional view of the semiconductor structure of FIG. 5 after a polysilicone dummy gate structure is disposed thereon in accordance with the present invention.

Referring to FIG. 6A, a cross sectional view of the semiconductor structure 100 of FIG. 5 after a polysilicone dummy gate structure 122 is disposed thereon is presented. Once the width 120 of the CT pillar 118 has been reduced, a polysilicon dummy gate structure 122 can be formed across and perpendicular to the CT pillar 118.

This can be accomplished by first removing the protective oxide layer 112 and hardmask layer 106 via such means as a wet etch process. A second protective hardmask layer 124 may be disposed over the fins 104 for added protection.

Next a polysilicone dummy gate layer 126 is disposed over the semiconductor structure 100 via such means as CVD or PVD. A hardmask stack 128 is then disposed over the dummy gate layer 126. The hardmask stack 128 may be disposed via such means as ALD, CVD, PVD or similar. The hardmask stack 128 includes at least one hardmask, but may include a plurality of hardmasks. In this exemplary embodiment, the hardmask stack 128 is a bi-layer hardmask stack including a first hardmask 130 and a second hardmask 132. The first and second hardmask layers 130, 132 may be composed of materials suitable for the application. For example, the first hardmask layer 130 may be SiO2 and the second hardmask layer 132 may be SiON.

Figure 6B:
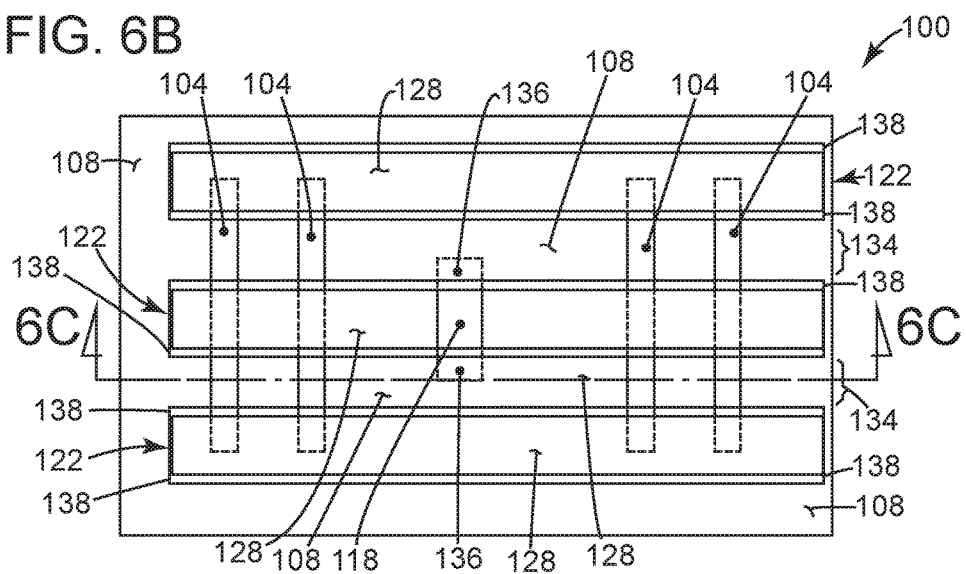
FIG. 6B is a top view of FIG. 6A in accordance with the present invention.

Referring to FIG. 6B, a top view of FIG. 6A is presented. Once the hardmask stack 128 is disposed on structure 100, it may be lithographically patterned and etched to form the top portions of dummy gate structures 122 and to expose the polysilicone dummy gate layer 126 in regions 134 of the semiconductor structure 100 not covered by the patterned hardmask stack 128. In other words, the polysilicone dummy gate layer 126 is exposed in the regions 134 between the top portions of the dummy gate structures 122. The exposed polysilicone layer 126 in regions 134 may then be anisotropically etched (for example via a RIE process) down the level of the FOX layer 108 to form the dummy gate structures 122.

Gate spacers 138 may then be formed on sidewalls of the dummy gate structures 122 to become an integral part of the dummy gate structure. The spacers 138 may be formed by disposing a conformal coat of spacer material, such as silicon nitride, over the patterned dummy gates 122 and anisotropically etching the spacer material. The gate spacer material may be composed of a dielectric material such as SiN, SiNC, SiBCN or similar.

The CT pillar 118 includes overextensions 136, which extend beyond the boundaries of the dummy gate structure 122 and into the regions 134 between the dummy gate structures. These overextensions 136, as well as portions of the fins 104 that are disposed in the regions 134 (i.e. not covered by the dummy gate structure 122), become exposed once the polysilicone layer 126 is RIE etched away. These exposed overextensions 136 are next anisotropically etched down to self-align the CT pillar with the dummy gate structure 122. Next the portions of the fins 104 that are also exposed in the regions 134 are anisotropically etched down to about the level of the FOX layer 108. This anisotropical etching of the overextensions 136 and fins 104 in regions 134 can be done, for example, by either two separate RIE processes, as a single RIE process that etches both overextensions and fins during the process or as an integral part of the RIE process that anisotropically etched the polysilicone layer 126 to form the dummy gates 122.

Figure 6C:
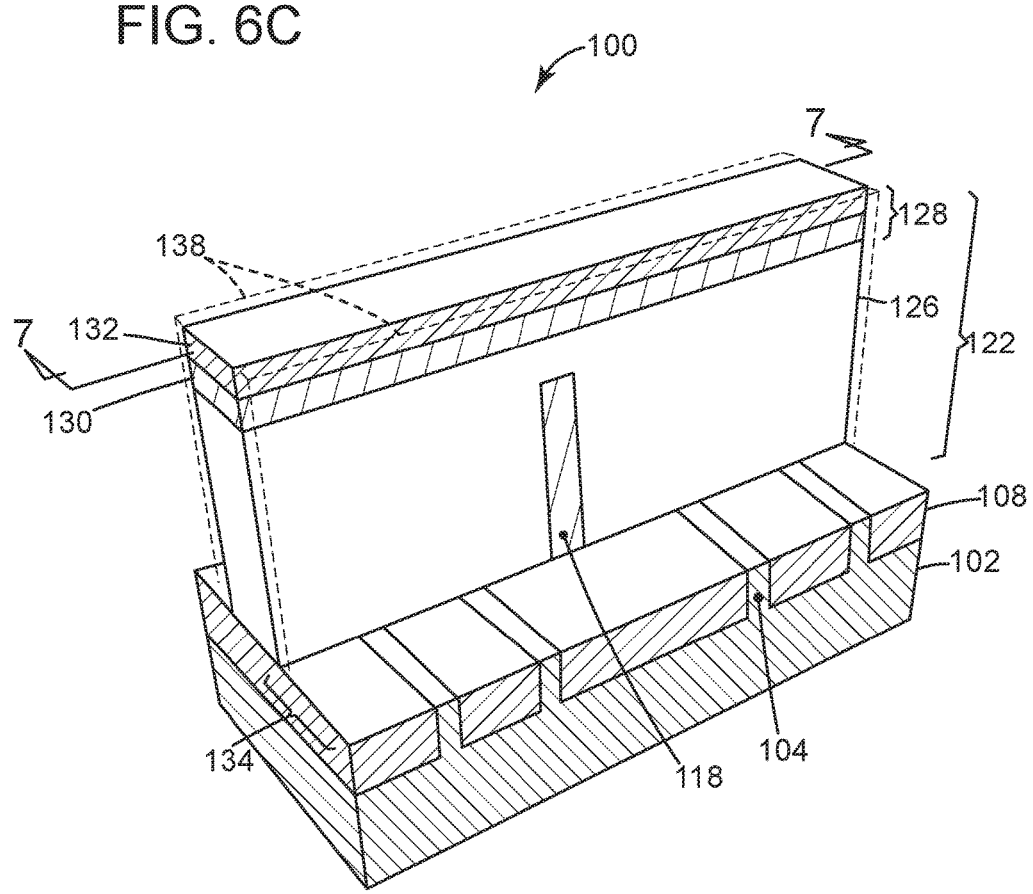
FIG. 6C is a perspective view of the semiconductor structure of FIG. 6B taken along the line 6C-6C in FIG. 6B in accordance with the present invention.

Referring to FIG. 6C, a perspective view of the semiconductor structure 100 taken along the line 6C-6C in FIG. 6B is presented. As illustrated, the CT pillar 118 is flush and self-aligned with the edges of the dummy gates structure 122, including the gate spacers 138 (shown in phantom). Additionally, the exposed fins 104 in the regions 134 between the dummy gates 122 are etched down to about the FOX layer 108. Source and drain regions (not shown) for FinFETs embedded in fins 104 can next be epitaxially grown from the etched down fins 104.

Referring to FIG. 7, a cross section view of semiconductor structure 100 taken through the line 7-7 of FIG. 6C after a replacement metal gate (RMG) process is completed is presented. The RMG process begins with an oxide fill layer 139 (best seen in FIG. 8B) disposed over the entire structure 100. Next the oxide fill layer 139 is planarized down to expose the top surface of the hardmask stack 128 between the gate spacers 138. This planarizing down of the oxide fill layer 139 can be accomplished via chemical mechanical polishing or similar.

Next the hardmask stack 128 and the polysilicone dummy gate layer 126 are removed via a wet etch process or similar to form a gate trench (not shown) between the gate spacers 138. Then a high k gate dielectric layer 140 is disposed over the structure 100 and within the gate trench. The high k gate dielectric layer may be composed of such material as hafnium dioxide (HfO2), nitride hafnium silicates (HfSiON) or the like.

Thereafter a gate metal stack 142 is disposed over the gate dielectric layer in order to fill the gate trench. The gate metal stack 142 is then chemical mechanical polished down to the level to the gate spacers 138.

The gate metal stack 142 can be a stack of gate electrode metal (such as Al, W, Cu or similar metal) disposed over a work-function metal (such as TiN, TaN, TiCAl, other metal-nitrides or similar materials). The high k gate dielectric layer 140 is used to electrically insulate the gate metal stack 142 from the fins 104. The work-function metal provides the work-function needed for proper FinFET operation, but typically has 10 to 100 times larger resistivity than the gate electrode metal. The gate electrode metal has a very low resistivity compared to the work-function metal.

At this stage of the process flow, it can be seen that the CT pillar 118 has separated the metal gate stack 142 into two almost complete metal gate structures, i.e., a first metal gate structure 144 and a second metal gate structure 146. The first and second metal gate structures 144, 146 are electrically isolated from the from each other accept for a strip 148 of gate metal disposed above the CT pillar 118.

Figure 8A:
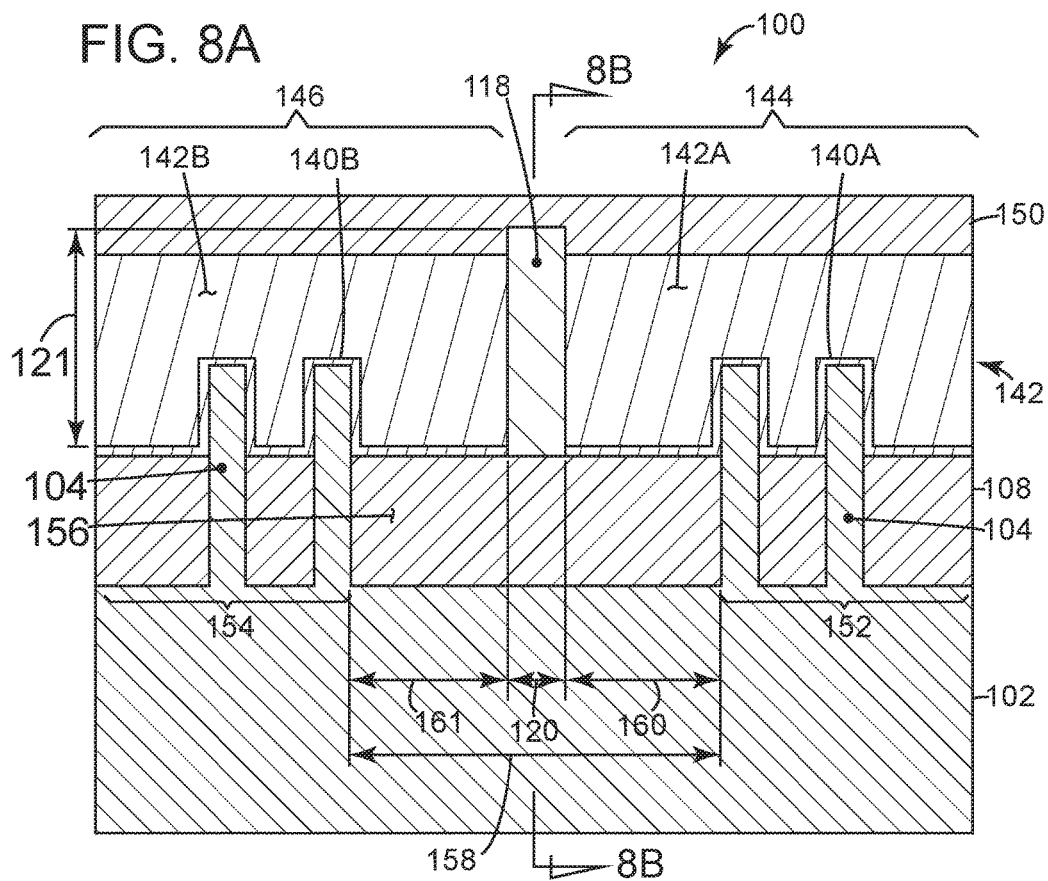
FIG. 8A is a cross sectional view of the semiconductor structure of FIG. 7 after a self-aligned contact (SAC) cap has been disposed on the first and second metal gate structures in accordance with the present invention.

Referring to FIG. 8A, a cross sectional view of the structure 100 of FIG. 7 after a self-aligned contact (SAC) cap 150 has been disposed on the metal gate structures 144, 146 is presented. The SAC cap 150 is formed by first recessing the gate metal stack 142 below the height 121 of the CT pillar 118. This can be done by a wet or dry etch process or similar.

A SAC cap layer (not shown) can then be disposed over the structure 100 and planarized down using a CMP process or similar to form the SAC cap 150, that is self-aligned with the gate spacers 138. The SAC cap 150 may be composed of a dielectric material that is similar, if not identical, to the material of the gate spacers 138. Therefore the SAC cap 150 may be composed of such material as SiN, SiNC, SiBCN or similar.

With the recessing of the metal gate stack 142 and the deposition of the SAC cap 150, the first metal gate structure 144 and the second metal gate structure 146 are now completely formed and electrically isolated from each other. As such, the two metal gate structures 144, 146 are now independent of each other and are terminated by CT pillar 118.

Moreover, the first metal gate structure 144 now includes a first metal stack layer 142A disposed over a first dielectric layer 140A and gate spacers 138 (best seen in FIG. 8B) disposed on sidewalls of the first metal stack layer 142A. Additionally, the second metal gate structure 146 now includes a second metal stack layer 142B disposed over a second dielectric layer 140B and the gate spacers 138 (best seen in FIG. 8B) also disposed on sidewalls of the second metal stack layer 142B.

Note that in an alternative embodiment, if the height 121 of the CT pillar 118 were originally made taller than the dummy gate structure 122 (best seen in FIG. 6A), it would be possible to isolate the first and second metal gate structures 144, 146 without the need for a SAC cap 150. However, making the height 121 taller than the dummy gate structure 122 may require other process steps that might be less desirable in some applications. Additionally, in the 10 nm class of semiconductors and beyond, a SAC cap is often used regardless of the need for a CT pillar.

The first metal gate structure 144 controls FinFETs embedded in a first array of fins 104 in a first Rx region 152. The second metal gate structure 146 controls FinFETs embedded in a second array of fins 104 in a second Rx region 154. The first and second Rx regions 152, 154 are separated by the isolation region 156, which has an overall width 158.

The overall width 158 of isolation region 156 includes the two distances 160, 161 that the first and second metal gate structures 144, 146 respectively overextend into the isolation region 156 plus the width 120 of the CT pillar 118. Because the CT pillar 118 is formed by anisotropically etching the CT pillar layer 114, rather than by refilling a high aspect ratio CT trench (such as prior art CT trenches 12 and 60), the CT pillar layer 118 can be made without voids or gaps that could potentially cause electrical shorts. Additionally, the width 120 of the CT pillar 118 can be made very thin relative to prior art CT pillars. For example, the CT pillar could have a width 120 that is 15 nm or less, or 10 nm or less. Therefore the minimum overall width 158 of isolation region 156 can be reduced accordingly.

Also, because the CT pillar 118 is formed without cutting a CT trench into the dummy gate structure 122, the source and drain regions of the embedded FinFETs cannot potentially short across a CT trench when being epitaxially grown. Therefore the minimum distances 160, 161 that the gate structures 144, 146 can overextend into the isolation region 156 can also be reduced over that of the prior art. For example, the minimum distance 160 can be reduced to 12 nm or less, or even 10 nm or less. Therefore the overall width 158 of the isolation region could be reduced to 40 nm or less, or even 30 nm or less.

Figure 8B:
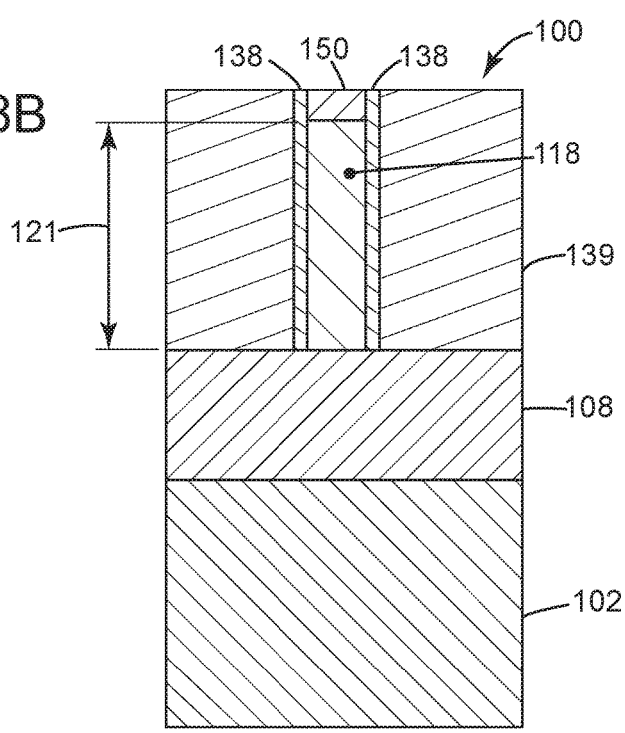
FIG. 8B is a cross sectional view of FIG. 8A taken through the line 8B-8B of FIG. 8A.

Referring to FIG. 8B, a cross sectional side view of the CT pillar 118 of structure 100 of FIG. 8A taken along the line 8B-8B of FIG. 8A is presented. As can be seen from this view, both the CT pillar 118 and SAC cap 150 are self-aligned with the gate spacer 138 between the first and second metal gate structures 144, 146. Also, as can be seen from this view, the oxide fill layer 139 is disposed over the FOX layer 108 and fills the structure 100 up to the level of the SAC cap 150.

Referring to FIG. 9, an alternative side view of the semiconductor structure 100 of FIG. 4 having a CT pillar 118 etched from an ultraviolet (UV) curable nitride material is presented. In an alternative embodiment, the CT pillar layer 113 (best seen in FIG. 4) can be made from a UV curable nitride.

When subjected to a UV light 162, a UV curable nitride will shrink. As such, the CT pillar 118 can be etched to a first width 164 lithographically, and then reduced to a second width 166 by subjecting the CT pillar 118 to UV light for a predetermined time and at a predetermined energy level.

The process of reducing the width of the CT pillar 118 made of a UV curable nitride via UV light can be done instead of trimming. Alternatively, both a trimming process and a UV light curing process can be used to form the CT pillar. For example, a rough trimming process can be used to reduce a width of a CT pillar from an initial width to an intermediate width, then a UV light curing process can be used to reduce the CT pillar to its final width.

Although the invention has been described by reference to specific embodiments, it should be understood that numerous changes may be made within the spirit and scope of the inventive concepts described. Accordingly, it is intended that the invention not be limited to the described embodiments, but that it have the full scope defined by the language of the following claims.

What is claimed is:

1. A method comprising:
providing a semiconductor structure having a substrate and a plurality of fins extending upwards from the substrate;
disposing a CT pillar layer over the semiconductor structure;
lithographically patterning a CT mask over the CT pillar layer;
anisotropically etching the CT mask to remove exposed portions of the CT pillar layer and to form a CT pillar between the fins;
disposing a dummy gate structure across the CT pillar; and
replacing the dummy gate structure with first and second metal gate structures that are electrically isolated from each other by the CT pillar.

2. The method of claim 1 comprising reducing an initial width of the CT pillar to a final width.

3. The method of claim 2 comprising reducing the initial width of the CT pillar by one of a trimming process and a UV light curing process.

4. The method of claim 2 comprising:
reducing the initial width of the CT pillar to an intermediate width by a trimming process; and reducing the intermediate width of the CT pillar to the final width by a UV light curing process.

5. The method of claim 1 wherein disposing a dummy gate structure comprising:
   disposing a dummy gate layer over the semiconductor structure;
   disposing a hardmask stack over the dummy gate layer;
   patterning and etching the hardmask stack to form a top portion of the dummy gate structure and to exposed the dummy gate layer in regions not covered by the patterned hardmask stack; and
   anisotropically etching the exposed regions of the dummy gate layer to form the dummy gate structure.

6. The method of claim 5 comprising forming gate spacers on sidewalls of the dummy gate structure such that the gate spacers become a part of the dummy gate structure.

7. The method of claim 6 comprising anisotropically etching overextensions of the CT pillar, which extend beyond the boundaries of the dummy gate structure, to remove the overextensions and to self-align the CT pillar with the dummy gate structure.

8. The method of claim 7 comprising anisotropically etching down exposed portions of the fins that are not covered by the dummy gate structure.

9. The method of claim 8 comprising epitaxially growing source and drain regions over the etched down fins.

10. The method of claim 1 wherein replacing the dummy gate structure comprises:
    providing the dummy gate structure with a hardmask stack disposed over a dummy gate layer and gate spacers disposed on sidewalls of the dummy gate layer;
    disposing an oxide fill layer over the semiconductor structure;
    planarizing the oxide fill layer down to expose a top surface of the hardmask stack; and
    removing the hardmask stack and dummy gate layer to form a gate trench between the gate spacers.

11. The method of claim 10 comprising:
    disposing a gate dielectric layer within the gate trench;
    disposing a gate metal stack over the gate dielectric layer to fill the gate trench;
    recessing the gate metal stack below a height of the CT pillar; and
    disposing a self-aligned contact cap on the metal gate stack to form the first and second metal gate structures.

12. The method of claim 1 wherein replacing the dummy gate structure comprises:
    providing the dummy gate structure with a hardmask stack disposed over a dummy gate layer and gate spacers disposed on sidewalls of the dummy gate layer;
    removing the hardmask stack and dummy gate layer to form a gate trench between the gate spacers;
    disposing a gate metal stack over the semiconductor structure to fill the gate trench; and
    recessing the gate metal stack below a height of the CT pillar.

13. The method of claim 12 comprising disposing a self-aligned contact cap on the metal gate stack to form the first and second metal gate structures.

14. The method of claim 2 wherein the final width is 15 nanometers or less.

15. The method of claim 2 wherein the final width is 10 nanometers or less.

* * * * *